United States Patent [19]

De Santis

[11] 4,071,819
[45] Jan. 31, 1978

[54] DEVICE FOR SENSING THE REAL PART IN A COMPLEX IMPEDANCE

[75] Inventor: Charles M. De Santis, Neptune, N.J.

[73] Assignee: The United States of America as represented by the Secretary of the Army, Washington, D.C.

[21] Appl. No.: 737,830

[22] Filed: Nov. 1, 1976

[51] Int. Cl.² ............................................. G01R 27/04
[52] U.S. Cl. .............................. 324/58 B; 324/57 R; 324/98; 324/123 R; 324/127
[58] Field of Search .............. 324/58 B, 58.5 B, 57 R, 324/98, 123 R, 127

[56] References Cited
U.S. PATENT DOCUMENTS

| | | | |
|---|---|---|---|
| 2,797,387 | 6/1957 | Adams et al. ...................... | 324/58 B |
| 3,335,368 | 8/1967 | Loughery et al. ............. | 324/58 B X |

Primary Examiner—Stanley T. Krawczewicz
Attorney, Agent, or Firm—Nathan Edelberg; Jeremiah G. Murray; Bernard Franz

[57] ABSTRACT

A device for accurately measuring the quantative value of the real part of a complex impedance without the measurement affecting or being affected by the reactive component of that impedance. The device is useful for impedance matching, and especially for tuning antennaes and the like such that the real part of the impedance can be appropriately matched with the source or receiver during tuning. The device operates by comparing the power delivered to the load with the power dissipated in a resistance R when a current proportional to the main line current passes through it. When both power readings are the same, which may be determined by a null indicator, the real part of the load impedance equals the resistance R.

7 Claims, 5 Drawing Figures

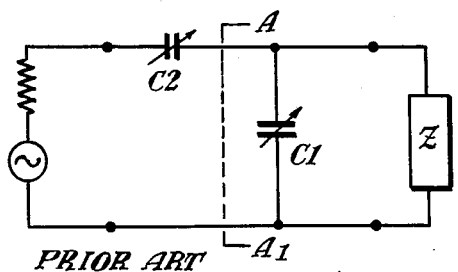
Fig. 1.
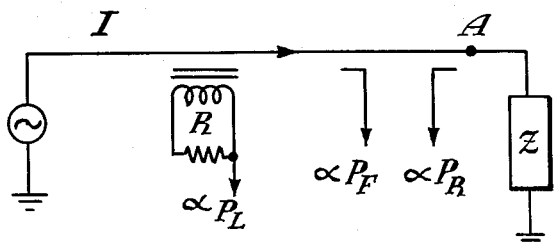
Fig. 3.
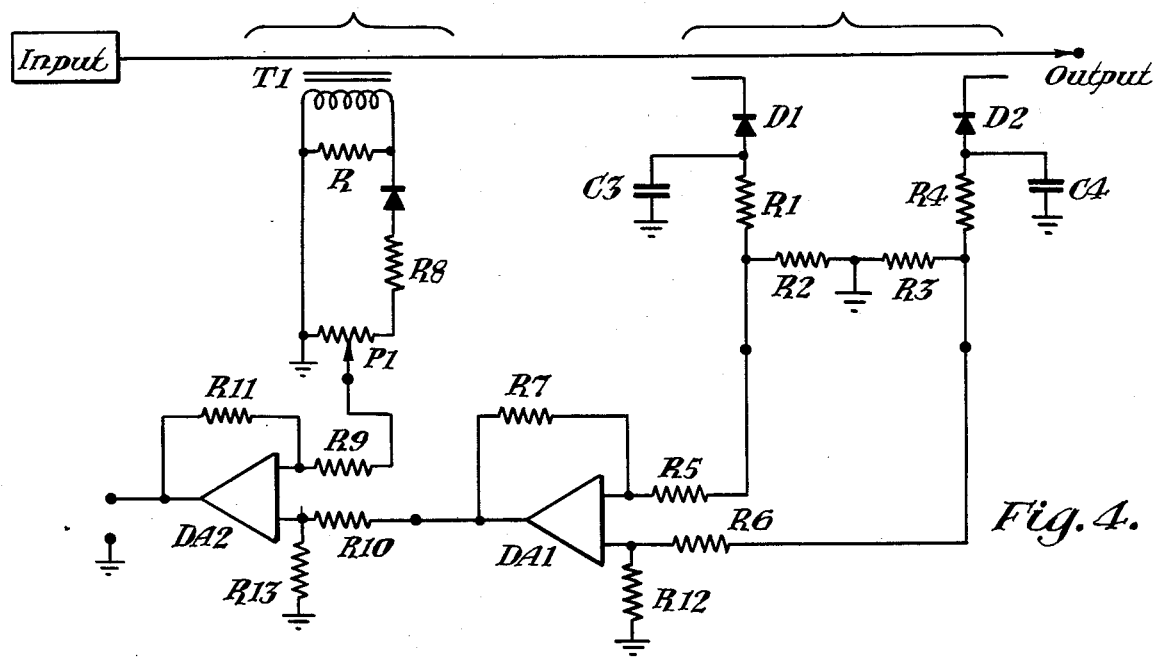
Fig. 4.
| $I_{LOAD}$ @ $f$ | | | $V_{TRANSFORMER}$ | $V_F$ | $V_{REFL}$ | $-V_{TR}$ | $V_F + V_R$ |
|---|---|---|---|---|---|---|---|
| R | X | f | | | | | |
| 47 | +122 | 2 | 0.65 | 1.35 | 0.7 | | 0 (null) |
| 10 | +65 | 2 | 2.0 | 1.56 | 1.1 | | -1.54 |
| 68 | +50 | 2 | 1.1 | 1.65 | <0.1 | | +0.55 |
| 47 | +200 | 4 | 0.58 | 3.2 | 2.6 | | +0.02 (null) |
| 68 | +100 | 4 | 0.56 | 3.2 | 2.45 | | +0.19 |
| 10 | +150 | 4 | 0.65 | 3.1 | 2.9 | | -0.45 |
Fig. 5.
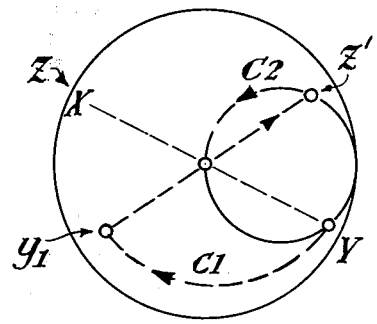
Fig. 2.

DEVICE FOR SENSING THE REAL PART IN A COMPLEX IMPEDANCE

The invention described herein may be manufactured and used by or for the Government for governmental purposes without the payment of any royalties thereon or therefor.

BACKGROUND OF THE INVENTION

This invention relates to a device for accurately determining the quantative value of the real part of a complex impedance, the real part value being useful for proper impedance matching in electrical systems.

In order to achieve maximum power transfer in any system, it is necessary to determine a proper impedance match between the load and the power source. In matching, the reactive component of a complex impedance is cancelled when resonance is achieved. However, it is also desirable to determine the real part of the impedance quantitatively so that the system being matched may be properly made compatible with a source of a receiver. For example, in tuning an antenna, the impedance of an electrically short antenna has a real part which is small compared to the imaginary part as well as being small compared to the impedance (usually real) of the power source of the receiver being used. To tune such an antenna, a tuning system is required which not only cancels the reactive components of the impedance (at resonance), but also transforms the real part of the complex impedance to a value comparable with the transmitter or receiver for achieving a maximum power transfer.

The instant invention provides a device which can measure the real part of a complex impedance and can utilize the information for manual or automatic tuning to achieve a proper impedance match for maximum power transfer.

The device described herein provides for a real part impedance sensor which operates by comparing the power delivered to the load with the power dissipated in a variable resistance R when a current proportional to the main line current is passed through the resistance.

BRIEF DESCRIPTION OF THE INVENTION

A device for quantitatively measuring the real part of a complex impedance without affecting the reactive components of the impedance that compares the power delivered to the load with the power dissipated in a resistance R when a current proportional to the main line current passes through the resistance. If the real part of the load impedance equals the resistance R, then the power readings must be the same (assuming the coupling coefficient is the same) for both. The device includes a means (such as a bi-directional coupler) for measuring the through-line power to the load and a current sensing means (such as a transformer) connected to a variable or selected resistance. The output of the bi-directional coupler is connected to a first differential amplifier which has its output connected to one input of a second differential amplifier. The output of the variable or fixed resistance and transformer circuit is also connected as an input to the second differential amplifier. Whenever the output of the second differential amplifier is at a null indication, the power delivered to the load is equal to the power dissipated in selected resistance R. The value of the resistance thus becomes a quantitative value of the real part of the impedance.

A torroidal transformer may be used to sample the current flowing to the load in the main line. The open circuit voltage of this transformer is $$v_{oc} = -jwMI \tag{1}$$

where $M$ is a mutual impedance, $I$ is the load current, and $w$ is the angular velocity. This voltage $v_{oc}$ drives current through the transformer secondary and the resistor whose value is selected to coincide with the desired real part of the complex impedance. The resistance may be a potentiometer that can be varied. The current flowing in the secondary circuit is $$i_s = -jwMI/R + jwL_2 \tag{2}$$

which is proportional to or approximately $M/L_2(I)$ if the resistance $R$ is less than $wL_2$. The power dissipated in $R$ is determined by $$P_4 = (M/L_2)^2 R. \tag{3}$$

A diode operating as a square law device is utilized as a detector and the resultant DC voltage developed is then proportional to the power dissipated in $R$.

A conventional bi-directional coupler is utilized to measure the power delivered to the load because of its ease of implementation while still providing through-line power. Other through-line devices which measure the power to the load could also be used. Diodes are used to develop voltages proportional to the forward and reflected powers. The difference in these voltages constitutes the measure of the power delivered to the load. Matching of these diodes improves the band width characteristics of the invention. The invention can be utilized with either manual or automatic tuning since, with an automatic tuning system, the output of the device can be arranged so that the output voltage is negative if the resistance of the load is less than the reference resistance and positive if the resistance of the load is greater than the reference resistance. Calibration may be accomplished by connecting a non-reactive resistor of a pre-determined value to the output port and adjusting the voltage from the transformer using a potentiometer to equal the voltage difference at the coupler ports. One advantage of the instant invention is that the mismatch will not affect the operation of the sensor. During calibration, the real part sensor will now give a null indication when the real part of the load impedance equals the desired pre-set value.

It is an object of this invention to provide a sensor which measures the real part of an unknown impedance without affecting the operation of the sensor.

It is another object of this invention to provide a device which will measure the real part of an impedance over a wide frequency range.

But yet still another object of this invention is to provide a device which can measure the real part of any impedance and can be constructed of readily available components.

And yet still another object of this invention is to provide a sensor which can indicate when the real part of an unknown impedance is above or below a specified value and can provide a null indication when the real part of an impedance equals a specifided value.

But yet still another object of this invention is to provide a sensor for determining the real part of an unknown impedance which may be utilized for manual and automatic tuning and impedance matching.

In accordance with these and other objects which will be apparent hereinafter, the instant invention will now be described with particular reference to the accompanying drawings.

BRIEF DESCRIPTION OF THE DRAWINGS

FIG. 1 shows a schematic diagram of a conventional "L" network tuner circuit.

FIG. 2 depicts a Smith impedance chart showing a "L" network impedance transformation for the circuit shown in FIG. 1.

FIG. 3 shows a schematic diagram utilized to explain the principles of the instant invention.

FIG. 4 shows a schematic diagram of the preferred embodiment of the instant invention.

FIG. 5 shows a table of experimental measurements achieved when utilizing the circuit shown in FIG. 4.

PREFERRED EMBODIMENT OF THE INVENTION

Tuning and matching of an antenna, for example, can be accomplished by using an "L" network as shown in FIG. 1. Although capacitors are shown as tuning and matching elements, inductors or a combination of inductors and capacitors can be used. In FIG. 1 capacitors are chosen since it is assumed that the load reactance is always inductive. FIG. 2 shows a Smith impedance chart depicting the "L" network impedance transformation for tuning the load of FIG. 1 to fifty ohms. Capacitor C1 is adjusted so that the real part of the impedance to the right of plane AA' equals 50 ohms, while the imaginary part remains inductive. Capacitor C2 is adjusted to cancel this inductive reactance to achieve a matched condition. Study of the transformation (FIG. 2) shows the importance of finding the fifty ohm locus using capacitor C1. This is one example of the utility of a real part sensor.

Referring now to FIG. 3, an alternating current generator is shown supplying power to load Z. The load is considered to be a fixed complex impedance either in series or parallel with a variable reactance such that the equivalent impednce measured at terminal A can be made to have real and imaginary components which vary over some specified range. The real part sensor operates by comparing the power delivered to the load Z with the power dissipated in a resistance R when a current I passes through the resistance R. If the real part of the load impedance equals the resistance R, then both power readings must be the same (assuming that the coupling coefficients alpha are the same for both).

One embodiment of the instant invention is shown in FIG. 4 to accomplish measurement of the real part of the unknown complex impedance of the circuit shown in FIG. 3. A bi-directional coupler is utilized as a through-line power measurement device that includes diodes D1 and D2 which are connected to the inputs of a differential amplifier DA1. The diodes at D1 and D2 develop voltages proportional to the forward and the reflected powers, respectively. The difference in these voltages is the measure of the power delivered to the load. For best results these diode D1 and D2 should be matched to improve the band width characteristics of the sensor. Thus the differential amplifier DA1 provides an output signal which represents the power to the load. The output of differential amplifier DA1 is connected as an input to a second differential amplifier DA2.

Current to the load is sensed and utilized in the comparative measurement by transformer T1 coupled across the resistance R and (as shown in FIG. 4) potentiometer P1. The output of this circuit itself is an input to differential amplifier DA2. A null indication at the output of differential amplifier DA2 is indicative that the resistance coupled to transformer T1 is equal to the real part of the load impedance since both power readings must be the same (assuming that the coupling coefficient is the same for both). Through the use of potentiometer P1, the resistance can be adjusted until a null signal is achieved at the output of differential amplifier DA2. This can be done both manually or utilizing an automatic tuning device. When utilizing an automatic tuning device, the signals can be arranged so that the output voltage is some negative value if the resistance of the load is less than the reference resistance and a positive value if the resistance of the load is greater than the reference resistance.

In the circuit in FIG. 4, $R_1$, $R_4$ and $R_8$ are 18k; $R_2$ and $R_3$ are 100k; $R_5$, $R_6$, $R_9$ and $R_{10}$ are 10k; $R_7$, $R_{11}$, $R_{12}$ and $R_{13}$ are 470k; $C_3$ and $C_4$ are 0.05 $\mu f$.

FIG. 5 shows a table of experimental measurements utilizing the circuit shown in FIG. 4 for varying load conditions. The frequency $f$ is in megahertz, and the voltages are in millivolts.

The device shown in FIG. 4 could be utilized in a more general application for measuring the real part of any impedance. The fixed resistor R on the output of the current transformer could be replaced with a potentiometer having a calibrated dial. In use, an unknown impedance would be connected to the output port and the potentiometer would be varied until a null was achieved. Thus the real part value of the complex impedance could be read off the potentiometer dial. The upper limit on the measurement range would be imposed by the conditions in equation (2), described above.

The instant invention has been shown and described herein in what is considered to be the most practical and preferred embodiment. It is recognized, however, that departures may be made therefrom within the scope of the invention and that obvious modifications will occur to a person skilled in the art.

What I claim is:

1. A device for connection in a transmission line between a high frequency power source and a load for measuring the quantitative value of the real part of a complex impedance of the load comprising:

through-line power measurment means comprising forward and reflected power sensors coupled to said transmission line and first dectector means connected to said sensors to derive two voltages proportional respectively to the forward and reflected power;

a first comparison means connected to said first detector means with said two voltages as inputs, and having an output representing the difference between the forward and reflected power;

separate through-line current sensing means including a standard resistor connected so that radio-frequency current proportional to the line current flows through it, second detector means connected thereto to derive a voltage proportional to the power dissipated in the standard resistor;

a second comparison means having one input from the second detector means and another input from the output of said first comparison means, so that when its output is a null the real part of the load impedance is equal to a predetermined value depending on the value of said stanard resistor.

2. A device as set forth in claim 1, wherein said through-line power measurement means includes a bidirectional coupler in which said first detector means comprises two matched diodes for respectively deriving said two voltages.

3. A device a set forth in claim 2, in which said separate through-line current sensing means comprises a current transformer with its primary in series in said transmission line, and with said standard resistor connected across its secondary winding,
   wherein said second detector means comprises a diode in series with a resistance voltage divider connected across said standard resistor,
   and wherein for said second comparison means said one input is a tap of said resistance voltage divider.

4. A device as set forth in claim 3, in which calibration may be effected by connecting a non-reactive resistance of said predetermined value as said load, and adjusting said tap to obtain a null output from said second comparison means.

5. A device as set forth in claim 3, wherein said first and second comparision means comprise respectively first and second differential amplifiers.

6. A device as set forth in claim 3, wherein said standard resistor is variable, and the setting thereof when there is a null output from said second comparison means indicates the value of said real part of the load impedance.

7. A device as set forth in claim 3, wherein the output of said second comparision means may be used for control of automatic tuning means to adjust said real part of the load impedance until a null output is obtained.

* * * * *